United States Patent [19]

Tieden

[11] 4,051,394
[45] Sept. 27, 1977

[54] ZERO CROSSING AC RELAY CONTROL CIRCUIT

[75] Inventor: Jansey D. Tieden, Puyallup, Wash.

[73] Assignee: The Boeing Company, Seattle, Wash.

[21] Appl. No.: 666,642

[22] Filed: Mar. 15, 1976

[51] Int. Cl.² ............................................ H03K 17/00
[52] U.S. Cl. ............................... 307/310; 307/296 A; 307/318; 307/354; 361/173
[58] Field of Search ............ 307/235 E, 252 UA, 318, 307/311, 310; 317/124

[56] References Cited

U.S. PATENT DOCUMENTS

| | | | |
|---|---|---|---|
| 3,223,850 | 12/1965 | Carrozza et al. | 307/235 E |
| 3,342,996 | 9/1967 | Crusinberry | 317/124 |
| 3,537,757 | 11/1970 | Griffin | 307/235 R |
| 3,697,782 | 10/1972 | Matoaka | 307/235 E |
| 3,816,763 | 6/1974 | Korn et al. | 307/252 UA |

Primary Examiner—Stanley D. Miller, Jr.
Assistant Examiner—B. P. Davis
Attorney, Agent, or Firm—Christensen, O'Connor, Garrison & Havelka

[57] ABSTRACT

An AC relay control circuit comprising a pair of back-to-back, series connected zener diodes control current flow through a control resistor. The control resistor is connected in parallel with parallel, reverse-connected light emitting diodes forming the light emitting portions of optical isolators. The photo transistor portions of the optical isolators are connected in parallel and control the generation of a trigger signal adapted to control the closure of relay contacts. Regardless of the instantaneous state of the AC voltage waveform (e.g., positive or negative), during the higher portions of the AC voltage waveform, one or the other of the LED's is forward biased and emits light, causing its related photo transistor to be turned on and the trigger signal to be at a low level. As the AC waveform approaches the next zero crossing point, it drops below the breakdown level of the zener diodes, causing current flow through the control transistor (and the forward bias voltage) to terminate, causing the previously lit LED to go out. The trigger signal then rises to a high level adapted to cause relay contact closure. The time between trigger signal rise and the zero crossing point is exactly related to the relay closure time.

9 Claims, 2 Drawing Figures

ZERO CROSSING AC RELAY CONTROL CIRCUIT

BACKGROUND OF THE INVENTION

This invention is directed to relays and, more particularly, to control circuits for controlling the closure of relay contacts when AC is applied across the contacts.

In many electronic control systems AC power is applied to a load through relays. In many instances relatively low voltage control systems are utilized to sense and manipulate data and, in accordance with that data, generate control signals. The control signals, in turn, control the closure of relay contacts so that AC power is applied to the desired loads at the desired point in time. The loads may be in the form of relatively large banks of lamps (lampbanks), adapted to display information in numeric or alphanumeric form, visible at relatively large distances such as by personnel located in an N/C machine tool area. Alternatively, the load may comprise electric motors or other electric devices requiring relatively high voltage power. The AC power may be single phase or multi-phase (e.g., three phase) power depending upon the nature and requirements of the particular load.

One of the major disadvantages of relays controlling AC is the arcing that occurs when the relay contacts are closed at some point other than the zero crossing point in the AC waveform. More specifically, if relay contacts are closed when a relatively high voltage is applied across the contacts, arcing occurs. Arcing causes deterioration of relay contacts and, thus, reduces relay life. In order to overcome this disadvantage, in recent years, relatively high voltage semi-conductor devices (e.g., silicon controlled rectifiers, triacs, etc.) have replaced relays in many electrical systems. However, these devices have voltage and power limits that prevent their use in many other systems. Moreover, in many instances, particularly when high power is involved, these devices are more expensive than desirable. Thus, while relays have certain undesirable features, they also have certain desirable features, particularly in the area of cost and power transfer capability. In some situations they are the only device available for use.

It will be appreciated from the foregoing brief discussion that it would be desirable to provide a circuit for controlling relay contact switching such that the instantaneous AC voltage existing across the contacts is at a minimum level (preferably zero) when the contacts close. Obviously, switching at a minimum voltage level will result in lower arcing and, thus, longer contact life.

Therefore, it is an object of this invention to provide an AC relay control circuit.

It is a further object of this invention to provide an AC relay control circuit adapted to sense the impending occurrence of the zero crossing point of an AC voltage, and control the closure of relay contacts at the zero crossing point.

It is another object of this invention to provide an inexpensive, yet reliable, zero crossing AC relay control circuit.

It is a still further object of this invention to provide an AC relay control circuit adapted to prolong the life of the contacts of relays.

SUMMARY OF THE INVENTION

In accordance with principles of this invention, an AC relay control circuit that senses the impending occurrence of the zero crossing point of an AC voltage and generates a trigger signal adapted to cause relay contact closure at the zero crossing point is provided. A pair of back-to-back serially connected zener diodes control the current flow through a control resistor. The control resistor is connected in parallel with parallel, reverse-connected light emitting diodes (LED's) which form the light emitting portions of optical isolators. The photo transistor portions of the optical isolators are connected in parallel and are adapted to produce a trigger signal for controlling the closure of the relay contacts. Regardless of the state of the AC wave form (i.e., positive or negative), during the higher voltage portions of the AC wave form one or the other of the LED's emits light. This light emission causes the related photo transistor to be turned on and the trigger signal to be at a low level. As the AC waveform approaches its next zero crossing point, and drops below the zener diode breakdown point, current through the control resistor drops to zero. This current flow termination removes the forward bias from the lit LED causing it to be extinguished, whereby its related photo transistor stops conducting. At this point both photo transistors are non-conducting and, the trigger signal rises to a high level. The high level trigger signal allows (if gated with another control signal), or directly controls, the closure of the relay contacts. The time between trigger signal rise and the zero crossing point is exactly related to the closure time of the relay. Thus, the relay is adapted to close exactly at the zero crossing point whereby the voltage across the relay contacts is exactly at, or very near, zero when the contacts close. Since the voltage across the contacts is low when contact closure occurs, relay contact arcing and the resultant deterioration of the contacts is essentially eliminated.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENT

Figure 1:
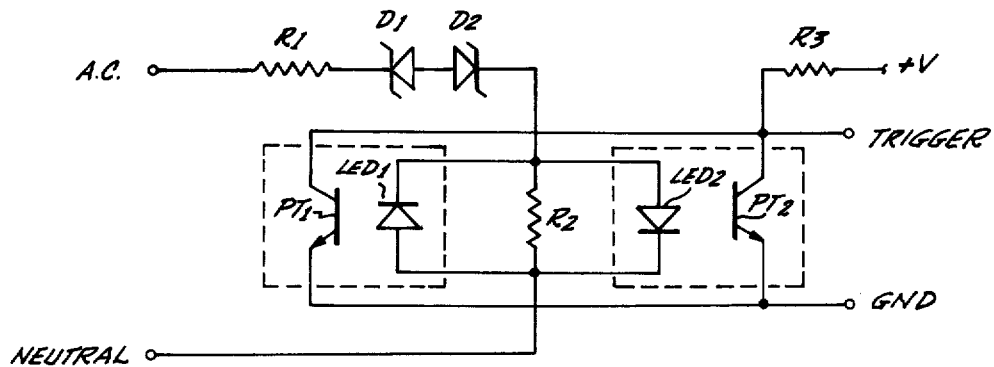
FIG. 1 is a schematic diagram of a preferred embodiment of the invention.

FIG. 1 is a schematic diagram of a preferred embodiment of the invention and comprises: two zener diodes designated ZD1 and ZD2; three resistors designated R1, R2 and R3; two light emitting diodes designated LED1 and LED2; and, two photo transistors designated PT1 and PT2.

LED1 in combination with PT1 forms a first optical isolator and LED2 in combination with PT2 forms a second optical isolator. While various types of optical isolators can be utilized by the invention, one suitable device (comprising two optical isolators) is the ILD 74 sold by Litronix Corporation, Cupertino, Calif.

The same AC voltage that is to be applied across the contacts of a relay adapted to be controlled by the invention is applied across a pair of terminals designated AC and neutral. The AC terminal is connected through R1 to the cathode of ZD1. The anode of ZD1 in connected to the anode of ZD2. The cathode of ZD2 is connected through R2 to the neutral terminal.

It will be appreciated from the foregoing circuit description that current will flow through R1 and R2 as long as the AC voltage applied to the AC/neutral terminals is greater than the breakdown voltage of either ZD1 or ZD2. Assuming the AC voltage is standard 115 volt AC line voltage, and the zener diodes have an 80 volt breakdown level (for example they are IN3003 zener diodes) current will flow through R1 and R2 as long as the AC voltage is above 80 volts. When the AC voltage drops below 80 volts, the zener diodes will terminate current flow through R1 and R2, one preventing current flow in one direction and the other preventing current flow in the other direction. Termination of such current flow will terminate the voltage drop across R2.

LED1 and LED2 are connected in parallel with R2, but in reverse directions. During one entire half of the AC cycle, regardless of the actions of ZD1 and ZD2, one or the other of LED1 and LED2 will be biased off. The other LED, as long as there is a satisfactory amount of current through R2 will be forward biased and emit light. Thus, light emission will occur only when the AC wave is above the voltage breakdown point of ZD1 or ZD2, whichever is operative. In this manner, LED1 and LED2 in essence sense the polarity of the AC voltage and only emit light when the voltage in either direction is above a predetermined level, set by ZD1 and ZD2.

The emitters of PT1 and PT2 are connected together and to a ground terminal. The collectors of PT1 and PT2 are connected together and to a trigger terminal. The collectors of PT1 and PT2 are also connected through R3 to a bias voltage source designated +V. R3 is a pull-up resistor that prevents floating of the system.

The ground terminal is adapted for connection to one side of the coil of the relay to be controlled. As used herein the term "relay" refers to both AC and DC relays since either may couple AC power through its contacts.

When the invention is used in combination with a DC control system, the trigger terminal, for example, may be connected to the clock input of a JK flipflop having a control signal applied to a control input of the flipflop. A related output of the flipflop is, in turn connected to the other side of the relay coil. When a control signal produced by a control system, adapted to indicate that a relay contact closure is desired, occurs, the next occurring trigger signal causes the relay contacts to close. In this manner, the control signal indicates that a closure is desired and the trigger signal, as will be better understood from the following discussion, times the closure to occur at the zero crossing point of the AC cycle.

When the invention is used in combination with an AC control system, the trigger terminal, for example, may be connected to the control terminal of a TRIAC. The TRIAC, in turn, is connected to the coil of an AC relay to apply power thereto.

As noted above, ZD1 and ZD2 may be IN3003 zener diodes and the optical isolators may be ILD 74's. If such devices are used, and assuming the AC input is 115 volts and that it is desired to provide a trigger signal 3 milliseconds before the AC crossing point, R1 (which is a current limiting resistor) may be chosen to have a value 2,000 ohms and R2 (which is a control resistor a value of 50 ohms. In such a circuit R3 may be chosen to equal 5,000 ohms.

It is pointed out here that three milliseconds has been chosen as an exemplary value because many relays have a three millisecond delay time between the time a trigger signal is applied to the coil of the relay and the closure of the relay contacts. If the time delay of the relay to be used with the invention is other than 3 milliseconds, obviously, zener diodes having a voltage breakdown at corresponding greater or lesser voltage levels, as necessary, must be chosen. The choice is based on the invention's requirement that the time delay between the onset of the trigger signal and the zero crossing point must be equal to the time delay between the application of a trigger signal to the related relay and closure of the relay's contacts.

Figure 2:
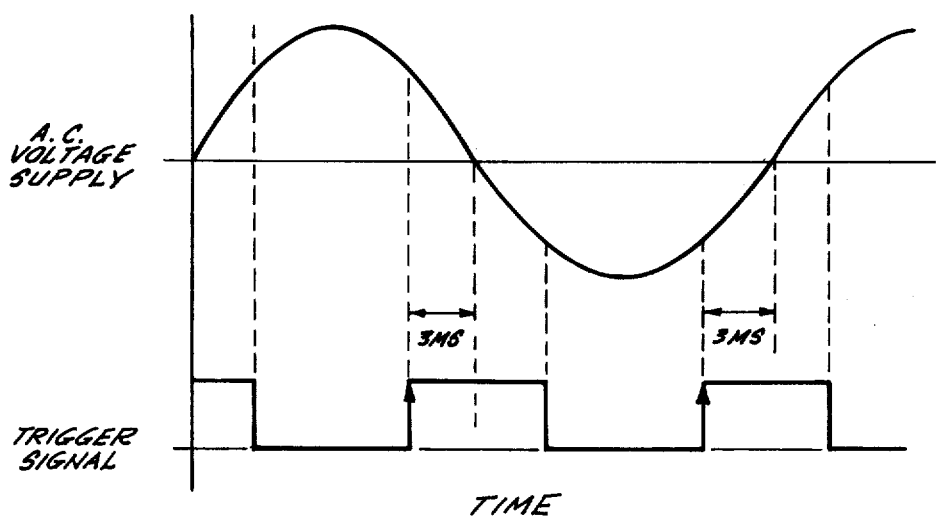
FIG. 2 is a waveform diagram illustrating the waveform of an AC supply voltage and the related trigger signal produced by the embodiment of the invention illustrated in FIG. 1.

In summary, ZD1 and ZD2 control current flow through control resistor R2. When current flows through R2, because the AC voltage is above the breakdown level of ZD1 and ZD2, one of the LED's will be biased off and the other LED will be biased on. The lit LED will, in essence, cause the trigger terminal to be grounded. However, as the AC wave approaches the zero crossing point, the current through R2 will terminate. The current termination point is determined by the voltage breakdown level of the zener diodes. When current flow terminates, as best illustrated in FIG. 2, the emission of light from the previously lit LED will terminate because it will no longer be biased on. This action will cause its related photo transistor to be turned off, whereby the trigger voltage will climb to a predetermined level.

The trigger voltage, as noted above, may be used to directly control the closure of contacts of a related relay or be combined with a control signal through a gate to control the closure of the relay contacts.

After the zero crossing point, when the voltage breakdown level in the opposite direction is reached, the other LED will start to emit light, whereby its related photo transistor will ground the trigger terminal. At this point, the trigger signal terminates. Thereafter, as the voltage in the reverse direction starts to again approach zero, the now lit LED will go off and the trigger signal will again rise. Hence, a trigger voltage exists across each zero crossing point.

It will be appreciated from the foregoing description that the invention provides an uncomplicated AC relay control circuit. The control circuit senses the impending occurrence of the zero crossing point of an AC voltage in either direction. When the impending occurrence is sensed, a trigger signal is produced that is adapted to cause relay contacts to close at the zero crossing point. Such closure, substantially reduces arcing across the contacts and, the resultant destruction of the relay contacts.

The embodiments of the invention in which an exclusive property or privilege is claimed are defined as follows:

1. A zero crossing AC relay control circuit for controlling the closure of the contacts of a relay having a known, predetermined time interval between the application of a trigger voltage to said relay and the actual closing of said relay contacts, said zero crossing AC relay control circuit comprising:
   voltage breakdown means for controlling current flow through a circuit such the AC current only flows through said circuit if the instantaneous value of the AC voltage applied to said circuit is above a predetermined level, said voltage breakdown means further controlling said current flows such that current flow terminates a predetermined period of time before the AC voltage crosses zero, said predetermined period of time remaining generally constant from one AC cycle to the next and being substantially equal to the known predetermined time interval between the application of a trigger voltage to said relay and the closure of the switch contacts of said relay;

sensing means connected to said voltage breakdown means for sensing the absence of current flow controlled by said voltage breakdown means; and, trigger signal generating means connected to said sensing means for producing a relay-operating trigger signal when said sensing means senses the absence of the current flow controlled by said voltage breakdown means.

2. A zero crossing AC relay control circuit as claimed in claim 1 wherein said voltage breakdown means comprises a pair of zener diodes connected, back-to-back, in series.

3. A zero crossing AC relay control circuit as claimed in claim 2, wherein said sensing means comprises a control resistor connected in series with said back-to-back, series connected zener diodes.

4. A zero crossing AC relay control circuit as claimed in claim 3, wherein said trigger means comprises a pair of optical coupling elements, each of said optical coupling elements including a light emitting diode and a related photo transistor, said light emitting diodes connecting in parallel with said control resistor and in parallel, but opposite polarity, with each other, said photo transistors having their emitters and collectors connected together and between round and a bias voltage source such that when neither of said light emitting diodes is emitting light, the voltage drop across said parallel connected photo transistors is at a high level and when either of said light emittlng diodes is emitting light, the voltage drop across said parallel connected photo transistors is at a low level.

5. A zero crossing AC relay circuit as claimed in claim 4, including a current limiting resistor connected in series with said series connected back-to-back zener diodes and said control resistor and a pull-up resistor connected in series with the collector-emitter terminals of said parallel connected photo transistors.

6. A zero crossing AC relay control circuit as claimed in claim 2, wherein said trigger means comprises a pair of optical coupling elements, each of said optical coupling elements including a light emitting diode and a related photo transistor, said light emitting diodes connected to said sensing means and in parallel, but opposite polarity, with each other, said photo transistors having their emitters and collectors connected together and between ground and a bias voltage source such that when neither of said light emitting diodes is emitting light, the voltage drop across said parallel connected photo transistors is at a high level and when either of said light emitting diodes is emitting light, the voltage drop across said parallel connected photo transistors is at a low level.

7. A zero crossing AC relay control circuit as claimed in claim 1, wherein said sensing means comprises a control resistor connected in series with said voltage breakdown means.

8. A zero crossing AC relay control circuit as claimed in claim 7, wherein said trigger means comprises a pair of optical coupling elements, each of said optical coupling elements including a light emitting diode and a related photo transistor, said light emitting diodes connected in parallel with said control resistor and in parallel, but opposite polarity, with each other, said photo transistors having their emitters and collectors connected together and between ground and a bias voltage source such that when neither of said light emitting diodes is emitting light, the voltage drop across said parallel connected photo transistors is at a high level and when either of said light emitting diodes is emitting light, the voltage drop across said parallel connected photo transistors is at a low level.

9. A zero crossing AC relay control circuit as claimed in claim 1, wherein said trigger means comprises a pair of optical coupling elements, each of said optical coupling elements including a light emitting diode and a related photo transistor, said light emitting diodes connected to said sensing means and in parallel, but opposite polarity, with each other, said photo transistors having their emitters and collectors connected together and between ground and a bias voltage source such that when neither of said light emitting diodes is emitting light, the voltage drop across said parallel connected photo transistors is at a high level and when either of said light emitting diodes is emitting light, the voltage drop across said parallel connected photo transistors is at a low level.

* * * * *